United States Patent
Denda et al.

(10) Patent No.: US 6,435,955 B2
(45) Date of Patent: Aug. 20, 2002

(54) ABRASIVE MACHINE

(75) Inventors: Yasuhide Denda; Hisato Kuroiwa; Masanori Furukawa; Yoshio Nakamura, all of Nagano (JP)

(73) Assignee: Fujikoshi Machinery Corp., Nagano (JP)

(*) Notice: Subject to any disclaimer, the term of this patent is extended or adjusted under 35 U.S.C. 154(b) by 0 days.

(21) Appl. No.: 09/737,006

(22) Filed: Dec. 14, 2000

(30) Foreign Application Priority Data

Dec. 17, 1999 (JP) ............................................. 11-359440

(51) Int. Cl.$^7$ ............................................. B24B 29/00
(52) U.S. Cl. .................. 451/286; 451/41; 451/287; 451/288; 451/397; 451/398
(58) Field of Search .................. 451/41, 286, 287, 451/288, 397, 398

(56) References Cited

U.S. PATENT DOCUMENTS

| 5,857,899 A | * | 1/1999 | Volodarsky et al. | .......... 451/72 |
| 6,203,414 B1 | * | 3/2001 | Numoto et al. | .......... 451/288 |
| 6,309,290 B1 | * | 10/2001 | Wang et al. | .......... 451/398 |

FOREIGN PATENT DOCUMENTS

| JP | 4-343658 | 11/1992 |
| JP | 6-15563 | 1/1994 |
| JP | 08-229808 | 9/1996 |
| JP | 09-254020 | 9/1997 |
| JP | 11-077519 | 3/1999 |
| JP | 11-165255 | 6/1999 |
| JP | 11-277414 | 10/1999 |

* cited by examiner

Primary Examiner—Joseph J. Hail, III
Assistant Examiner—Shantese McDonald
(74) Attorney, Agent, or Firm—Jordan and Hamburg LLP

(57) ABSTRACT

The abrasive machine is capable of preventing deformation and bad abrasion of an abrasive cloth, maintaining flatness of an abrasive face of an abrasive plate and improving abrading accuracy. The abrasive machine comprises the abrasive plate and a holding unit for holding a work piece. In the holding unit, an inner head has a first concave section. An outer head has a second concave section. A holding plate is provided in the first concave section. An elastic holding member forms a first chamber. An outer enclosing member is provided to the outer head. An inner enclosing member is provided between the outer enclosing member and the inner head. A pressing member presses the abrasive face of the abrasive plate and encloses the holding plate. An elastic ring member a second chamber. A pressurizing unit pressurizes the chambers so as to press the work piece and the pressing member onto the abrasive face.

4 Claims, 8 Drawing Sheets

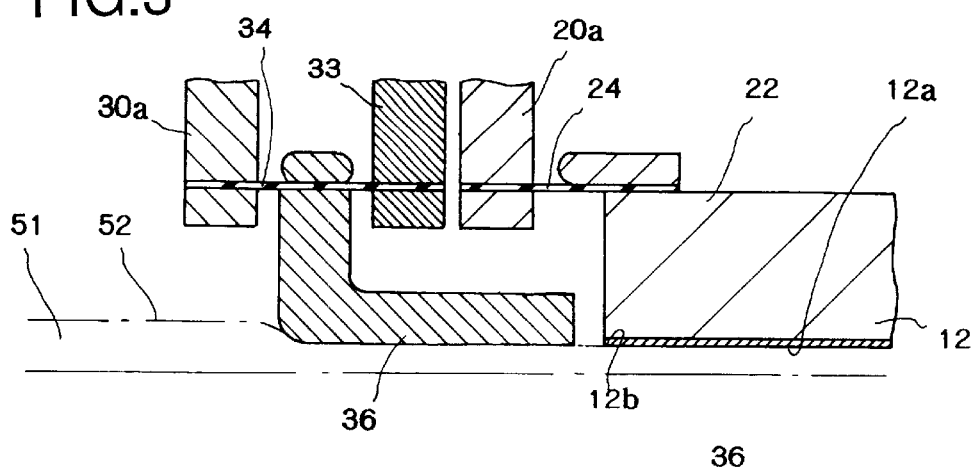
FIG.3
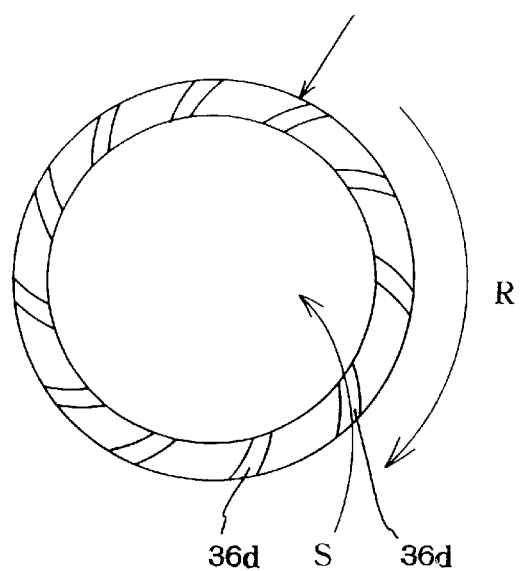
FIG.4
FIG.10
PRIOR ART
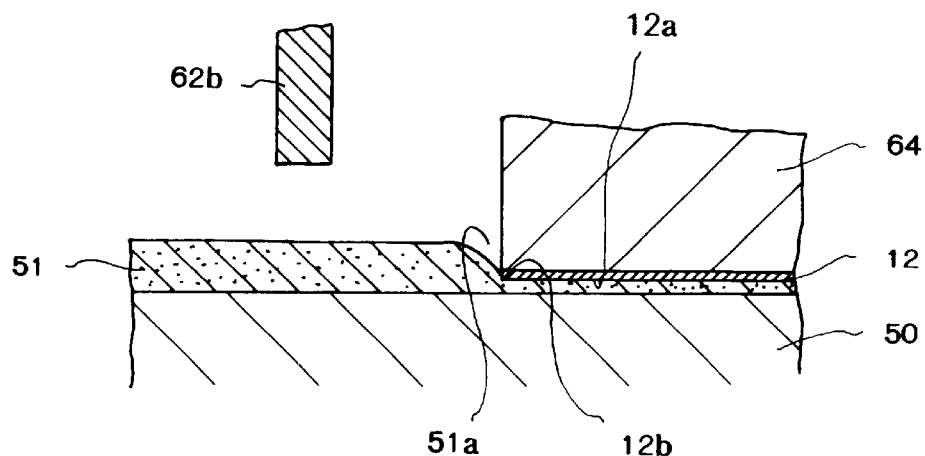

ABRASIVE MACHINE

BACKGROUND OF THE INVENTION

The present invention relates to an abrasive machine, more precisely relates to an abrasive machine, which comprises a holding unit for holding a work piece, e.g., a semiconductor wafer, and an abrasive plate having an abrasive face, which abrades a surface of the work piece by relatively moving the abrasive plate with respect to the holding unit. For example, the abrasive face abrades a surface of a semiconductor wafer, in which semiconductor chips are formed, like a mirror face.

Recently, circuits in semiconductor devices are highly integrated, so flatness and surface conditions of silicon wafers, etc., which will be substrates of semiconductor devices, must be highly improved. Further, insulating layers and cables paterns, which are formed on the wafer so as to form the devices, are abraded with higher flatness. Therefore, the abrasive machine must abrade the surfaces of the wafers, like mirror faces, with higher accuracy.

In a conventional abrasive machine, a whole surface of a wafer is uniformly pressed onto an abrasive face of an abrasive plate by an airbag of a wafer holding unit.

The wafer holding unit of the conventional abrasive machine will be explained with reference to FIGS. 9 and 10.

In FIG. 9, an abrasive plate 50 is rotated about a vertical shaft. An abrasive cloth 51 is adhered on an upper face of the abrasive plate 50 so as to form an abrasive face 52. The wafer holding unit 60 is provided above the abrasive plate 50. The wafer holding unit 60 is rotated about a vertical shaft and moved in the vertical direction.

The wafer holding unit 60 includes: a head 62 having a concave section 62a, whose opening section is headed downward; a wafer holding plate 64 having a holding face, on which the wafer 12 is held; an elastic member 66, whose outer edge 66b is fixed to an enclosing section 62b of the head 62 and whose inner edge 66a is fixed to an outer end section 64a of the wafer holding plate 64, being formed like a plate and capable of allowing the wafer holding plate 64 to move within a very small range; and an air-tightly sealed chamber 65 being formed, in the head 62, by the wafer holding plate 64 and the elastic member 66.

A vacuum unit 67 for sucking and holding the wafer 12 is communicated to sucking holes 67a, which are opened in a bottom face of the wafer holding plate 64, which acts as a wafer holding face, via an air tube 67b. By actuating the vacuum unit 67, the wafer 12 can be sucked and held on the wafer holding face of the wafer holding plate 64.

A pressurizing unit 68 supplies pressurized fluid to the chamber 65 so as to press the wafer 12 onto the abrasive face 52 of the abrasive plate 50 together with the wafer holding plate 64.

A pressure reducing unit 69 reduces inner pressure of the chamber 65.

A male tapered section 70, whose outer diameter is gradually reduced downward, is downwardly projected from an inner ceiling face of the head 62; a female tapered section 72, whose inner diameter is gradually increased upward, is upwardly projected from an upper face of the wafer holding plate 64. With this structure, the male tapered section 70 fits in the female tapered section 72 when the pressure reducing unit 69 reduces the inner pressure of the chamber 65.

In the conventional abrasive machine, the surface 12a of the wafer 12 to be abraded is capable of quickly following inclination, etc. of the abrasive face 52 because of the airbag function of the elastic member 66, e.g., a rubber plate, so that the whole surface 12a of the wafer 12 can be uniformly pressed onto the abrasive face 52 even if the abrasive face 52 is inclined. With this action, the whole surface 12a can be uniformly abraded or polished like a mirror face.

By fitting the male tapered section 70 in the female tapered section 72, the wafer holding plate 64 can be precisely positioned, so that the wafer 12 can be positioned or adhered at a correct position. Therefore, abrading accuracy and abrading efficiency can be improved, and abrading steps can be executed automatically.

However, in the conventional abrasive machine, the surface 12a of the wafer 12 is pressed onto the abrasive face 52 of the abrasive cloth 51, which is adhered on the abrasive plate 50, while abrading or polishing the wafer 12. A part of the abrasive cloth 51, on which the wafer 12 is pressed, is slightly caved downward with respect to other parts, so that a concave portion 51a (see FIG. 10) is formed. And, a lower outer edge 12b of the wafer 12 contacts an inner face of the concave portion 51a and is abraded thereby.

If the lower outer edge 12b of the wafer 12 is abraded by the inner face of the concave portion 51a of the abrasive cloth 51, the abrasive face 52 is waved and badly abraded, so that flatness of the abraded surface 12a of the wafer 12 is made lower.

The abrasive face 52 of the abrasive cloth 51, which has been waved and badly abraded, can be recovered by recovering means. In the conventional abrasive machine, for example, the recovering means, e.g., a dummy wafer, a ceramic plate, is attached to the wafer holding plate 64 of the holding unit 60, then the recovering means is pressed onto the abrasive face 52 so as to recover the damaged abrasive face 52. In the case of a new abrasive cloth 51, a surface condition of the new abrasive cloth 51 is uniformed by the recovering member.

The step of recovering the abrasive cloth 51 cannot be simultaneously executed with the abrasive step. If the recovering step is executed before or after the abrasive step, required time of the abrasive step and the recovering step must be longer and working efficiency cannot be improved.

Conditions, e.g., pressing force, rotational speed of the wafer holding plate 64, in the abrasive step are different from those in the recovering step, but the wafer holding plate 64 is used in the both steps. Therefore, the rotational speed of the wafer holding plate 64 and the pressing force applied to the wafer holding plate 64 (the inner pressure of the chamber 65) must be newly set when the abrasive step or the recovering step is executed. The change of the conditions is troublesome, so that working efficiency and manufacturing efficiency cannot be improved.

SUMMARY OF THE INVENTION

An object of the present invention is to provide an abrasive machine, which is capable of preventing deformation and bad abrasion of the abrasive cloth, maintaining flatness of the abrasive face of the abrasive plate and improving abrading accuracy.

To achieve the object, the abrasive machine of the present invention comprises:
  a holding unit for holding a work piece; and
  an abrasive plate having an abrasive face, which abrades a surface of the work piece by relatively moving the abrasive plate with respect to the holding unit,
  wherein the holding unit includes:
    an inner head having a first concave section, whose opening section is headed toward the abrasive face of the abrasive plate;

an outer head having a second concave section, in which the inner head is provided and whose opening section is headed toward the abrasive face of the abrasive plate, a holding plate being provided in the first concave section and having a holding face, on which the work piece is held;

an elastic holding member being fixed to the inner head and the holding plate, allowing the holding plate to move with respect to the inner head, and forming a first chamber for pressing the work piece in the first concave section with the holding plate;

an outer enclosing member being provided to the outer head and enclosing the inner head;

an inner enclosing member being provided between the outer enclosing member and the inner head and enclosing the inner head;

a pressing member for pressing the abrasive face of the abrasive plate, the pressing member being formed into a ring shape enclosing the holding plate;

an elastic ring member being fixed to the outer enclosing member and the inner enclosing member, holding and allowing the pressing member to move with respect to the outer head, and forming a second chamber in the second concave section; and a pressurizing unit introducing pressurized fluid into the first chamber and the second chamber so as to press the work piece onto the abrasive face of the abrasive plate with the holding plate and so as to press the pressing member onto the abrasive face of the abrasive plate.

In the abrasive machine of the present invention, the pressurized fluid is introduced into the first chamber of the inner head, so that the work piece, which has been held by the holding plate, can be pressed onto the abrasive face of the abrasive plate. Further, the pressing member can be pressed onto the abrasive face of the abrasive plate by pressurizing the second chamber. With this action, the pressing member can be pressed onto the abrasive face of the abrasive plate while the surface of the work piece is abraded, so that flatness of the abrasive face can be maintained, and working efficiency and abrading accuracy of the abrasive machine can be improved.

In the abrasive machine, the pressurized fluid may be introduce into the first chamber by a first pressurizing unit, and the pressurized fluid may be introduce into the second chamber by a second pressurizing unit. With this structure, the pressing member can be pressed onto the abrasive face of the abrasive cloth with pressing force corresponding to pressing force for pressing the work piece onto the abrasive face. Therefore, the work piece can be abraded with higher abrading accuracy.

The abrasive machine may further comprise:

an inner head driving unit for rotating the inner head about a shaft, which is arranged perpendicular to the surface of the work piece, which has been held by said holding plate; and an outer head driving unit for rotating the outer head about another shaft, which is arranged perpendicular to the surface of the work piece, which has been held by said holding plate. With this structure, rotaitonal speed of the work piece and the pressing member can be separately and properly controlled, so that the abrading accuracy can be improved.

In this abrasive machine, the inner enclosing member may be separable from the outer head, connected to the outer head by the elastic ring member so as to be moved together with the outer head, and rotatably held by the inner head with a bearing. With this structure, the inner head and the outer head including the inner enclosing member can be separately rotated and properly positioned.

BRIEF DESCRIPTION OF THE INVENTION

Embodiments of the present invention will now be described by way of examples and with reference to the accompanying drawings, in which:

FIG. 3 is an explanation view showing a state in which an abrasive face of an abrasive cloth, which is employed in the abrasive machine shown in FIGS. 1 and 2, is pressed by a pressing member;

FIG. 4 is a bottom view of a bottom face of a pressing member, which contacts an abrasive cloth;

FIG. 10 is an explanation view showing the state in which the abrasive face of the abrasive cloth, which is employed in the conventional abrasive machine shown in FIG. 9 is pressed by the wafer.

DETAILED DESCRIPTION OF THE PREFERRED EMBODIMENTS

Preferred embodiments of the present invention will now be described in detail with reference to the accompanying drawings.

First Embodiment

Figure 1:
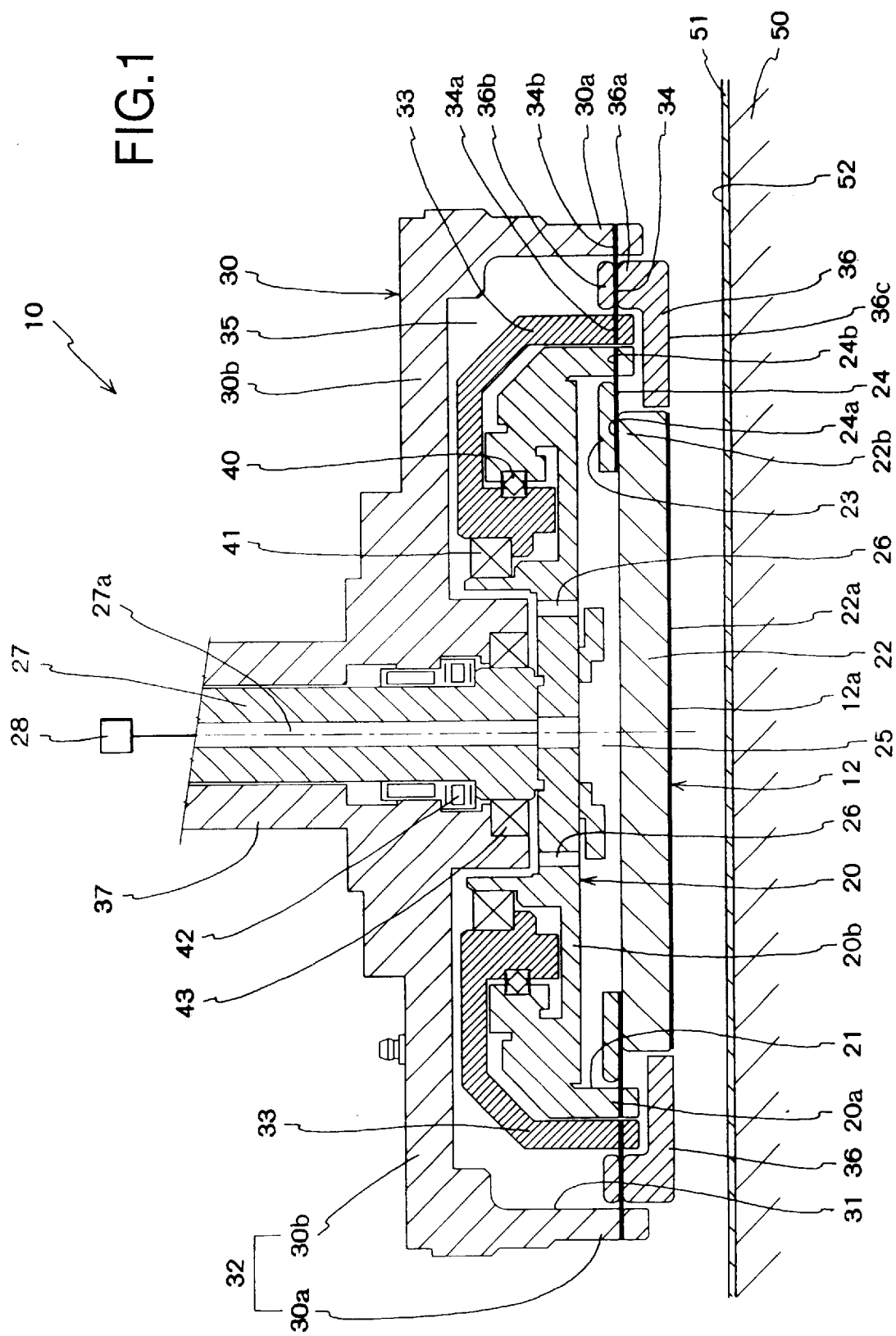
FIG. 1 is a sectional view of a holding unit of the abrasive machine of a first embodiment of the present invention.
Figure 2:
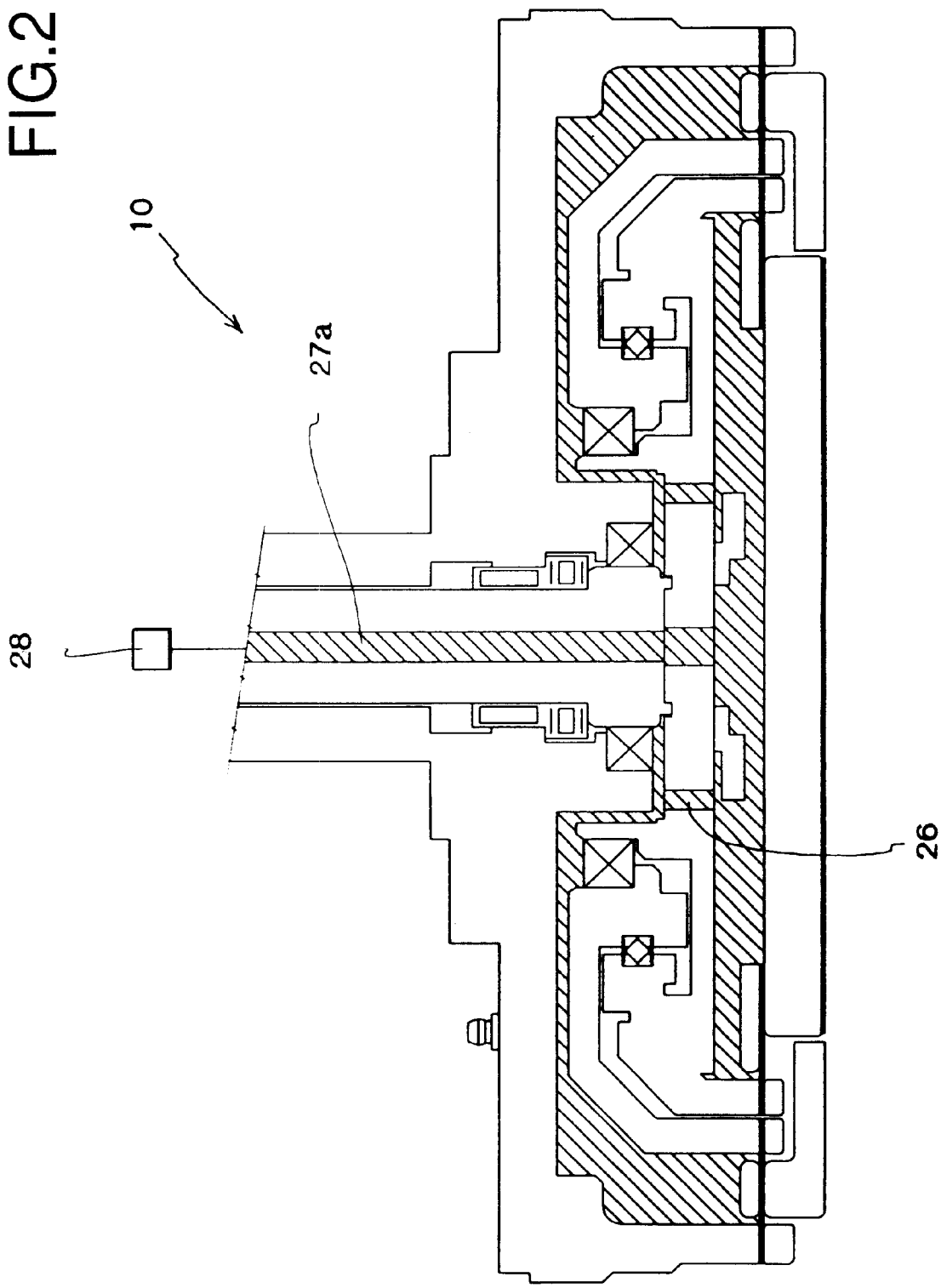
FIG. 2 is a sectional view of the holding unit of the first embodiment wherein compressed air is introduced thereinto.
Figure 5:
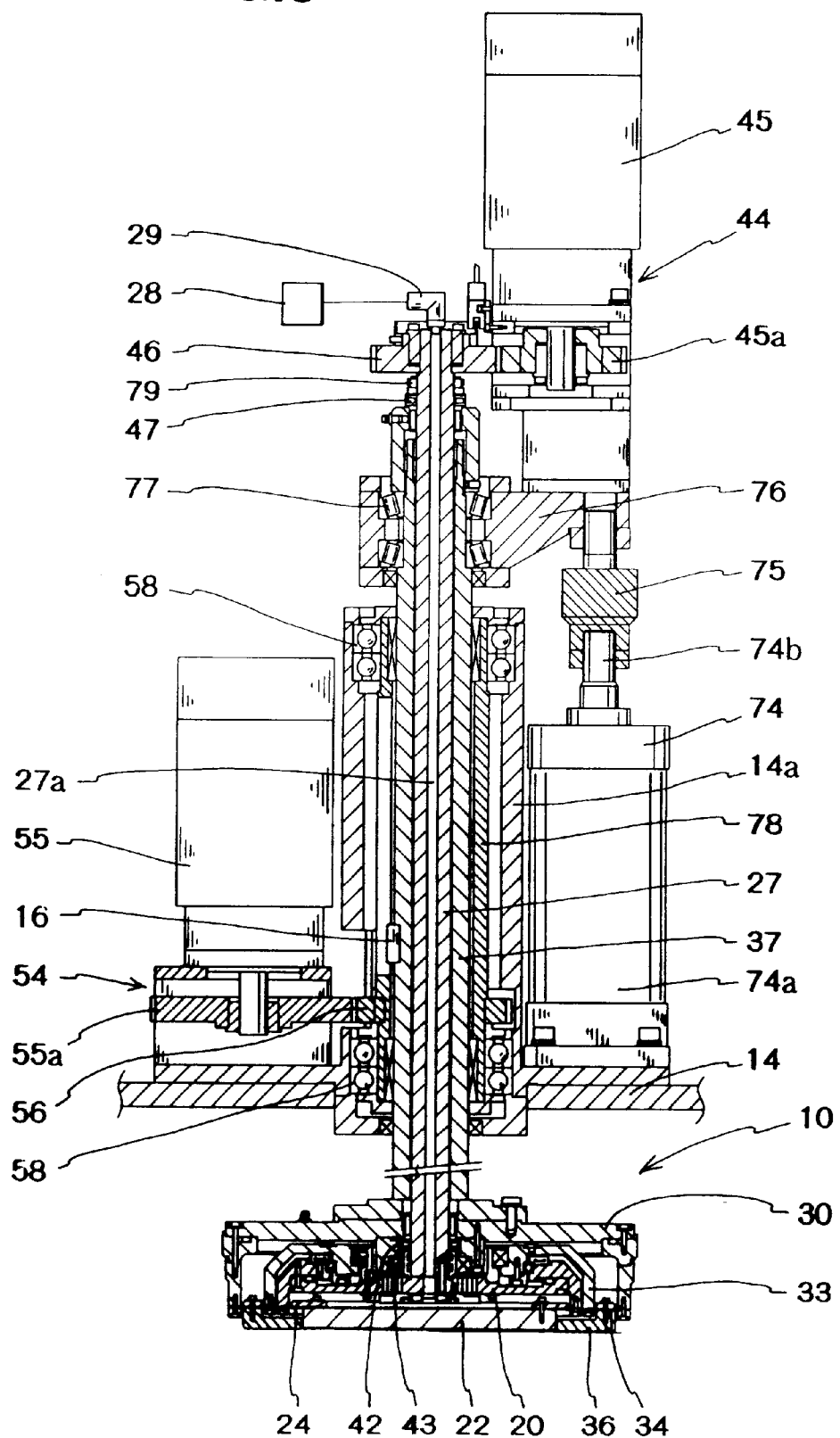
FIG. 5 is a driving mechanism of the abrasive machine of the first embodiment.

FIG. 1 is a sectional view of a holding unit of the abrasive machine of a first embodiment; FIG. 2 is a sectional view of the holding unit of, in which compressed air is introduced into the holding unit; FIG. 3 is an explanation view showing a state in which an abrasive face of an abrasive cloth is pressed by a pressing member; FIG. 4 is a bottom view of a bottom face of a pressing member, which contacts an abrasive cloth; and FIG. 5 is a driving mechanism of the abrasive machine.

In the first embodiment, the abrasive machine abrades or polishes a surface of a silicon wafer (a work piece). The abrasive machine comprises a holding unit 10 for holding the wafer 12 and an abrasive plate 50 having an abrasive face 52, which abrades the surface 12a of the wafer 12 by relatively moving the abrasive plate 50 with respect to the holding unit 10. The surface 12a of the wafer 12 can be polished like a mirror face.

The holding unit 10 includes: an inner head 20 having a first concave section 21, whose opening section is headed toward the abrasive face 52 of the abrasive plate 50; and an outer head 30 having a second concave section 31, in which the inner head 20 is provided and whose opening section is also headed toward the abrasive face 52 of the abrasive plate 50.

The inner head 20 includes: a wafer holding plate (a holding plate) 22 being provided in the first concave section 21 and having a holding face 22a, on which the wafer 12 is held; and an elastic holding member 24 being fixed to the inner head 20 and the holding plate 22, allowing the holding plate 22 to move, in the vertical direction, etc., with respect to the inner head 20 and forming a first chamber 25 for pressing the wafer 12 in the first concave section 21 with the holding plate 22.

Details of the inner head 20 and peripheral elements will be explained.

The inner head 20 constitutes a base portion of the holding unit 10, which holds the wafer 12. As described above, the inner head 20 has the first concave section 21, whose opening section is headed downward.

A bottom face 22a of the holding plate 22 holds the wafer 12 as a holding face. The holding plate 22 is provided in the inner head 20 and enclosed by an outer edge section 20a. The holding face 22a is located under a bottom face of the outer edge section 20a.

In the first embodiment, the wafer 12 is adhered onto the holding face 22a of the holding plate 22 by water. A bucking member (not shown) is adhered on the holding face 22a. The bucking member has highly adsorptive surface, so that the wafer 12 can be securely adhered thereon by surface tension and viscosity of a liquid, e.g., water.

In the case of adhering the wafer 12 onto the holding face 22a by water, a ring-shaped template (not shown), which is capable of enclosing the wafer 12, is attached on the holding face 22a so as to prevent the wafer 12 from sliding sideward. An inner diameter of the template is 1 mm or less, e.g., 0.3 mm, greater than an outer diameter of the wafer 12. In the present embodiment, the outer diameter of the wafer 12 is about 300 mm. As described above, the difference between the inner diameter of the template and the outer diameter of the wafer 12 is very small with respect to the outer diameter of the wafer 12. Thickness of the template is thinner than that of the wafer 12.

Sliding the wafer 12 on the holding face 22a can be prevented by other means other than the template. For example, an outer diameter of the holding face 22a is made equal to that of the wafer 12, and the sliding action of the wafer 12 may be prevented by a ring-shaped pressing member 36. By using the pressing member 36, over-abrasion of an outer edge 12b (see FIG. 10) of the wafer 12 can be prevented. Namely, the pressing member 36 presses the abrasive cloth 51 in the vicinity of the outer edge 12b of the wafer 12, so that the abrasive cloth 51 enclosing the outer edge 12b of the wafer 12 is pressed downward. With this action, friction between the outer edge 12b of the wafer 12 and the abrasive cloth 51 is made smaller, so that the over-abrasion can be prevented.

The elastic holding member 24 is made of an elastic material and formed into a plate. In the present embodiment, the elastic holding member 24 is made of a donut-shaped hard rubber, e.g., nitrile rubber including cloth.

An outer edge 24b of the elastic holding member 24 is fixed to the outer edge section 20a of the inner head 20; an inner edge 24a of the elastic holding member 24 is fixed to an upper face of an outer edge of the holding plate 22. Namely, the outer edge 24b of the elastic holding member 24 is vertically clamped by members constituting the outer edge section 20a of the inner head 20 and fixed by bolts (not shown). On the other hand, the inner edge 24a of the elastic holding member 24 is vertically clamped by the holding plate 22 and a press member 23 and fixed by bolts (not shown).

With this structure, the elastic holding member 24 holds and allows the holding plate 22 to move, in the horizontal and vertical directions, with respect to the inner head 20.

The first chamber 25 for pressing the wafer 12 is formed in the inner head 20 by the holding plate 22 and the elastic holding member 24. Pressurized fluid, e.g., compressed air, is introduced into the first chamber 25 by a pressurizing unit 28. By increasing inner pressure of the first chamber 25 by the pressurizing unit 28, the wafer 12 can be pressed onto the abrasive face 52 of the abrasive plate 50 with the holding plate 22, so that the surface 12a of the wafer 12 can be abraded or polished properly.

Note that, the pressurizing unit 28 has a pressure regulator (not shown) for adjusting the inner pressure of the first chamber 25.

The outer head 30 includes: an outer enclosing member 30a enclosing the inner head 20; and an inner enclosing member 33 being provided between the outer enclosing member 30a and the inner head 20 and enclosing the inner head 20; the pressing member 36, whose sectional shape is an L-shape, being formed into a ring shape enclosing the holding plate 22 and pressing the abrasive face 52 of the abrasive plate 50; and an elastic ring member 34 being fixed to the outer enclosing member 30a and the inner enclosing member 33, holding and allowing the pressing member 36 to move, in the vertical and horizontal directions, with respect to the outer head 30, and forming a second chamber 35 in the outer head 30.

Next, details of the outer head 30 will be explained.

The outer head 30 constitutes an outer base part of the holding unit 10, which holds the wafer 12. An upper section 30b, which is formed like a disk, and the ring-shaped outer enclosing member 30a are integrally connected in the outer head 30. The second concave section 31, whose opening section is headed downward, is formed inside of the inner enclosing member 33.

In the present embodiment, the inner enclosing member 33 is detachably attached to the outer head 30, and the elastic ring member 34 connects the inner enclosing member 34 to the outer head 30. With this structure, the inner enclosing member 33 is moved together with the outer head 30. Further, the inner enclosing member 33 is rotatably held by the inner head 20 with a bearing 40.

The inner enclosing member 33 is formed like an inverted bowl, and a through-hole is formed a center part thereof. A seal ring 41 is fitted to an inner edge of the inner enclosing member 33 so as to air-tightly seal a gap between the inner head 20 and the inner enclosing member 33, so that the second chamber 35 can be air-tightly sealed.

By employing the bearing 40 and the seal ring 41, the second chamber 35 can be air-tightly sealed, and the inner head 20 and the outer head 30, which includes the inner enclosing member 33, can be independently rotated.

The elastic ring member 34 is made of an elastic material and formed into a ring plate. In the present embodiment, the elastic ring member 34 is made of a donut-shaped hard rubber, e.g., nitrile rubber including cloth.

An outer edge 34b of the elastic ring member 34 is fixed to the outer enclosing member 30a of the outer head 30; an inner edge 34a of the elastic ring member 34 is fixed to the inner enclosing member 33, which is rotated together with the outer head 30. Namely, the outer edge 34b of the elastic ring member 34 is vertically clamped by members constituting the outer enclosing member 30a and fixed by bolts (not shown). On the other hand, the inner edge 34a of the elastic ring member 34 is vertically clamped by members constituting the inner enclosing member 33 and fixed by bolts (not shown). The pressing member 36, whose pressing face is headed toward the abrasive face 52 of the abrasive plate 50, is fixed to the elastic ring member 34.

With this structure, the elastic ring member 34 holds and allows the pressing member 36 to move, in the horizontal and vertical directions, with respect to the inner head 20.

The second chamber 35 for pressing the pressing member 36 is formed in the outer head 30 by the elastic ring member 34. The pressurized fluid, e.g., compressed air, is introduced into the second chamber 35 by the pressurizing unit 28. By increasing inner pressure of the second chamber 35 by the pressurizing unit 28, the pressing member 36 can be pressed onto the abrasive face 52 of the abrasive plate 50, so that the abrasive face 52 of the abrasive plate 50 can be properly pressed. Details of this action will be explained later.

Note that, the pressurizing unit 28 supplies the compressed air to the first and the second chambers 25 and 35. Namely, as shown in FIG. 2, the compressed air is supplied via an air path 27a. Then, the compressed air is introduced into the first chamber 25 and simultaneously introduced into the second chamber 35 via through-holes 26 of an upper section 20b of the inner head 20. In FIG. 2, spaces filled with the compressed air are indicated by hatching. With this structure, the wafer 12 and the pressing member can be simultaneously pressed onto the abrasive face 52.

The action of the pressing member 36 will be explained with reference to FIG. 3, which shows the state in which the pressing member 36 is pressed on the abrasive cloth 51. The compressed air, which has been introduced into the first chamber 25, presses the surface 12a of the wafer 12 on the abrasive face 52 of the abrasive cloth 51 with a predetermined force. Simultaneously, the compressed air, which has been introduced into the second chamber 35, presses the bottom face of the pressing member 36, which is parallel to the abrasive face 51, on the abrasive face 52 of the abrasive cloth 51. By pressing the pressing member 36 on the abrasive face 52, a part of the abrasive cloth 51, which corresponds to the bottom face of the pressing member 36 and encloses the lower outer edge 12b (see FIG. 10) of the wafer 12, is pressed downward. In the conventional abrasive machine, as shown in FIG. 10, the lower outer edge 12b of the wafer 12 contacts the inner face of the concave portion 51a and the contact part of the abrasive cloth 51 is concentratedly damaged, so that the abrasive face 52 is waved and badly abraded. On the other hand, in the first embodiment, friction is not concentrated to the lower outer edge 12b of the wafer 12 (see FIG. 3), so that the abrasive cloth 51 is not concentratedly damaged and waving and bad abrasion of the abrasive cloth 51 can be prevented. Further, number of recovering the abrasive cloth 51 can be reduced.

The pressing member 36 is, for example, a ring-shaped metal disk or a net-shaped disk. Further, diamond grains may be included in the bottom face of the pressing member 36, and the bottom face may be coated with diamond CVD film. If the pressing member 36 is made of a deposited grind stone or a ceramic having a properly rough surface, the abrasive face 52 of the abrasive plate 50 can be efficiently dressed. Thus, a dressing member may be used as the pressing member 36.

The pressing member 36 of the present embodiment is formed into a ring shape and fixed to the elastic ring member 34. To properly fixed to the elastic ring member 34, the pressing member 36 has a thicker section 36a. The elastic ring member 34 is clamped by the thicker section 36a and a ring member 36b, and the bolts (not shown) integrates them, so that the pressing member 36 can be fixed to the elastic ring member 34.

The pressing face 36c (the bottom face) of the pressing member 36 is inwardly extended from a lower end of the thicker section 36a. An inner edge of the pressing face 36c is extended close to an outer edge of the holding plate 22. The pressing member 36 is extended and covers bottom faces of the inner enclosing member 33 and the outer edge section 20a. With this structure, the pressing face 36c of the pressing member 36 is efficiently located.

If the pressing member 36 wholly encloses an outer circumferential edge of the wafer 12, it is difficult to supply slurry for abrading the wafer 12 onto the abrasive face 52 of the abrasive cloth 51.

To overcome this disadvantage, guide grooves 36d, which introduce the slurry onto the abrasive face 51, are formed in the bottom face of the pressing member 36 as shown in FIG. 4.

The guide grooves 36d are curved in directions corresponding to the rotational direction "R" of the pressing member 36. With this structure, the slurry can be properly introduced into the inner space of the pressing member 36 via the guide grooves 36d. One of flowing directions of the slurry is shown as an arrow "S". A sectional shape of the guide groove 36d may be a V-shape, a U-shape, etc.

Forming the guide grooves 36d is effective in the case of employing the large abrasive plate 50, whose diameter is much greater than that of the wafer 12. On the other hand, in the case of employing the abrasive plate 50, whose diameter is equal to or slightly greater than that of the wafer 12, through-holes may be formed in the abrasive plate 50 and the abrasive cloth 51 so as to supply the slurry onto the abrasive face 52, via the through-holes, from a lower side. In the case of the small abrasive plate 50, it is difficult to effectively supply the slurry, from outside, to the whole surface 12a of the wafer 12.

By the pressing member 36, abrading the wafer 12 and pressing the abrasive face 52 of the abrasive plate 50 can be executed simultaneously, so that the deformation and the bad abrasion of the abrasive face 52 can be prevented. Therefore, working efficiency can be improved, and wafers can be always abraded, by the good abrasive face 52, with higher abrading or polishing accuracy.

If the dressing member is used for pressing the abrasive face 52 and the dressing step is separately executed from the abrading step, frequency of executing the dressing step can be reduced, so that working and manufacturing efficiency can be improved.

A rotational driving mechanism and an vertical driving mechanism of the innr head 20 and the outer head 30 will be explained.

An inner bearing 42 is provided between an outer circumferential face of an inner shaft 27, which is integrated with the inner head 20, and an inner circumferential face of an outer shaft 37, which is integrated with the outer head 30. With this structure, the inner head 20 and the outer head 30 can be rotated at different speed.

An inner seal ring 43 air-tightly seals a gap between the outer circumferential face of the inner shaft 27 and the inner circumferential face of the outer shaft 37.

An inner head driving unit 44 rotates the inner head 20 about a shaft, which is provided to the holding plate 22 and arranged perpendicular to the surface 12a of the wafer 12, which has been held by the holding plate 22.

As shown in FIG. 5, a motor 45 rotates the inner head 20. A pinion gear 45a is fixed to an output shaft of the motor 45.

A driven gear 46 is fixed to an upper end of the inner shaft 27 and engaged with the pinion gear 45a.

An upper bearing 47 allows the inner shaft 27 to smoothly rotate with respect to the outer shaft 37.

With this structure, the inner shaft 20, which is fixed to a lower end of the long inner shaft 27, can be rotated by the motor 45. And the wafer 12, which has been held by the holding plate 22, can be rotated about an axis, which is perpendicular to the surface 12a of the wafer 12, together with the inner head 20.

An outer head driving unit 54 rotates the outer head 30 about a shaft, which is provided to the holding plate 22 and arranged perpendicular to the surface 12a of the wafer 12, which has been held by the holding plate 22.

As shown in FIG. 5, a motor 55 rotates the outer head 30. A pinion gear 45a is fixed to an output shaft of the motor 55.

A driven gear 56 is fixed to the outer shaft 37 and engaged with the pinion gear 55a.

Bearings 58 are vertically arranged and allow the outer shaft 37 to smoothly rotate with respect to a base 14.

With this structure, the outer shaft 30, which is fixed to a lower end of the long outer shaft 37, can be rotated by the motor 55. And the pressing member 36, which has been connected to the outer head 30 by the elastic ring member 34, can be rotated about an axis, which is perpendicular to the surface 12a of the wafer 12, together with the outer head 30.

Since the inner head driving unit 44 and the outer head driving unit 54 are separately provided, rotational speed of the wafer 12 and the pressing member 36 can be separately and properly controlled, so that abrading conditions can be properly defined and the abrading accuracy can be improved.

In FIG. 5, a cylinder unit 74 vertically moves a head section, which includes the inner head 20, the inner shaft 27 and the outer shaft 37.

A rear end 74a of the cylinder unit 74 is fixed to the base 14; a front end of a cylinder rod 74b of the cylinder unit 74 is fixed to an elevating member 76 with a connector 75.

Note that, the motor 45 for rotating the inner head 20 is fixed on the elevating member 76.

The outer shaft 37 is not vertically moved with respect to the elevating member 76. But the outer shaft 37 is rotatably held by a bearing 77, which is capable of receiving load in the thrust direction.

A stopper 79 is provided to the upper end of the inner shaft 27, so that the inner shaft 27 is not vertically moved with respect to the outer shaft 37. But the inner shaft 27 is rotatably held by the bearings 42 and 47. With this structure, the inner shaft 27 is also rotatably held by the elevating member 76 so as not to fall down.

A cylindrical section 14a is upwardly extended from the base 14. The outer shaft 37 is pierced through the cylindrical section 14a. The outer shaft 37 is vertically moved and rotated therein. An inner cylindrical member 78 is integrated with the outer shaft 37 by a key 16, so that the inner cylindrical member 78 can be rotated together with the outer shaft 37. The driven gear 56 covers the inner cylindrical member 78 and is fixed thereto. The pinion gear 55a of the motor 55 is engaged with the driven gear 56. Note that, the motor 55 for rotating the outer head 30 is fixed on the base 14.

By driving the motor 55, the outer head 30 is rotated together with the outer shaft 37. Further, by driving the cylinder unit 74, the outer shaft 37 is slid in the inner cylindrical member 78, so that the head section can be moved in the vertical direction.

As described above, the driving mechanism constitutes: means for vertically moving the wafer 12 so as to make the surface 12a of the wafer 12 contact the abrasive face 52 of the abrasive plate 50; means for rotating the wafer 12 about its own axis; and means for rotating the pressing member 37 about its own axis.

An inlet 29 is provided to the upper end of the inner shaft 27 and communicated to the pressurizing unit 28. The inlet 29 is also communicated to the air path 27a, which is formed in the inner shaft 27 and communicated to the first chamber 25. Note that, in the present embodiment, the pressurizing unit 28 is a compressor.

A distributor (not shown) may be provided to the inlet 29 so as to prevent a twist of air tubes, which is occurred by the rotation.

Further, the abrasive machine has a slurry feeding unit (not shown).

Second Embodiment

A second embodiment will be explained with reference to FIGS. 6 and 7. The elements explained in the first embodiment are assigned the same symbols and explanation will be omitted.

Figure 6:
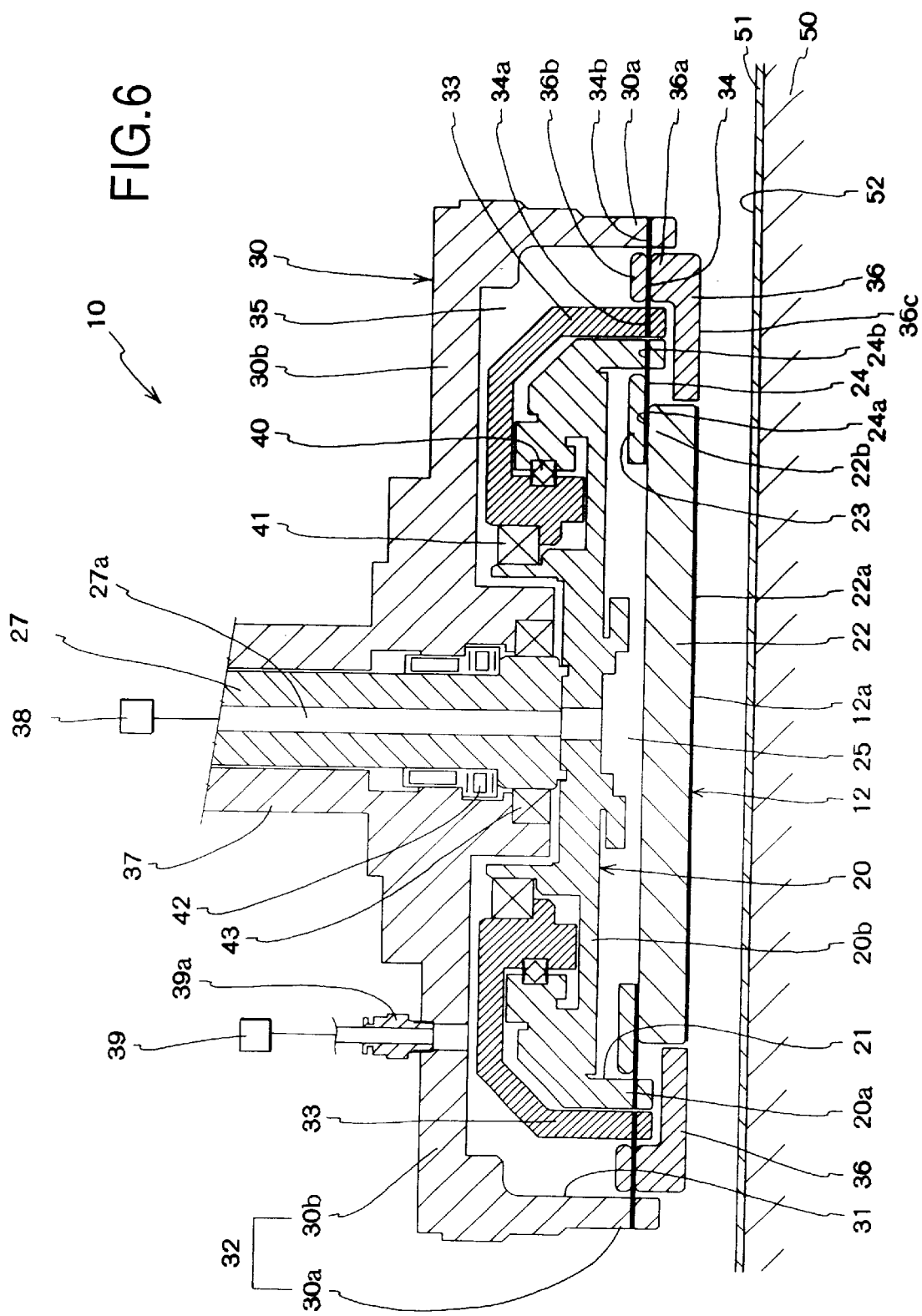
FIG. 6 is a sectional view of the holding unit of the abrasive machine of a second embodiment.

FIG. 6 is a sectional view of the holding unit of the abrasive machine of the second embodiment. And, FIG. 7 is a sectional view of the holding unit of the second embodiment wherein the compressed air is introduced thereinto.

Features of the second embodiment are a first pressurizing unit 38, which introduces the pressurized fluid into the first chamber 25 so as to press the surface 12a of the wafer 12, which has been held by the holding plate 22, onto the abrasive face 52 of the abrasive plate 50; and a second pressurizing unit, which introduces the pressurized fluid into the second chamber 35 so as to press the pressing member 36 onto the abrasive face 52 of the abrasive plate 50. Namely, two pressurizing units 38 and 39 are separately provided. An inlet 39a, to which the pressurized fluid, e.g., compressed air, is supplied from the second pressurizing unit 39 so as to pressurize the second chamber 35, is provided to an upper face 30b of the outer head 30. Unlike the first embodiment, no through-holes 26 (see FIG. 1) are not formed.

Figure 7:
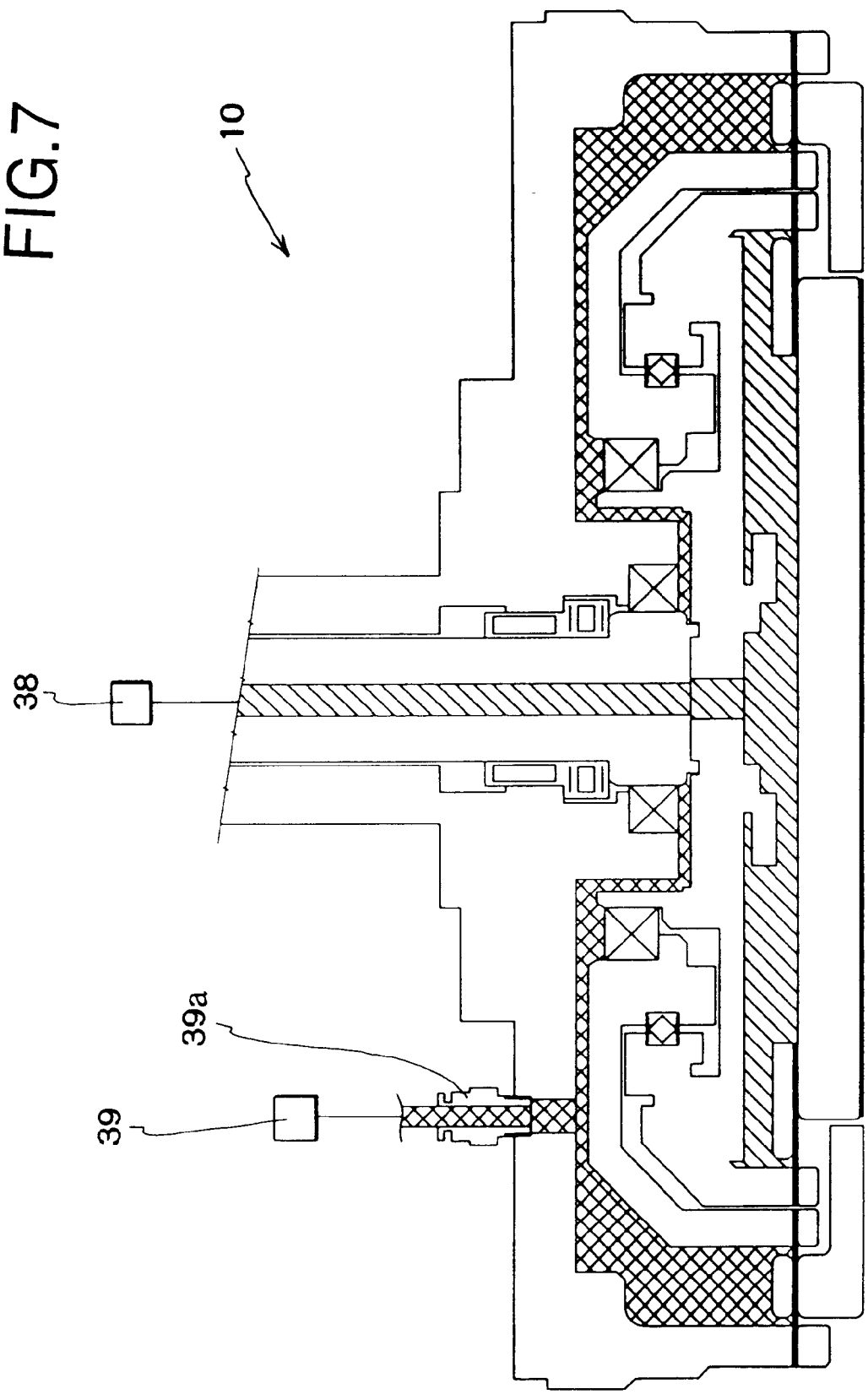
FIG. 7 is a sectional view of the holding unit of the second embodiment wherein the compressed air is introduced thereinto.
Figure 8:
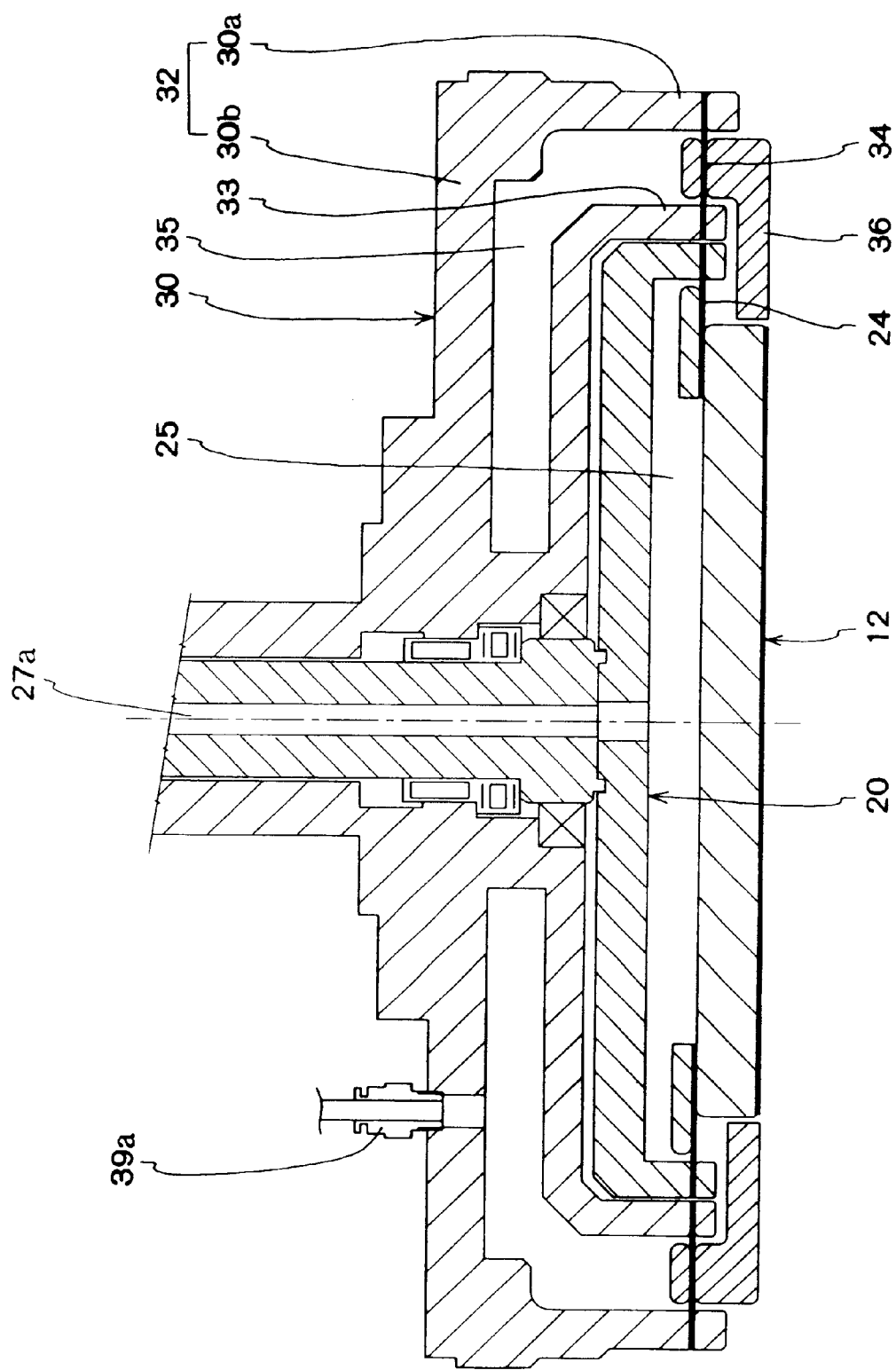
FIG. 8 is a sectional view of the holding unit of the abrasive machine of a third embodiment.

In the second embodiment, spaces including the first chamber 25 are filled with the compressed air from the first pressurizing unit 38 and indicated by parallel-hatching; spaces including the second chamber 35 are filled with the compressed air from the second pressurizing unit 39 and indicated by cross-hatching (see FIG. 7).

Pressure of the compressed air supplied into the first chamber 25 can be different from pressure of the compressed air supplied into the second chamber 35. Namely, the force pressing the wafer 12 and the force for pressing the pressing member 36 can be controlled separately. With this structure, the pressing member 36 can be pressed onto the abrasive face 52 of the abrasive cloth 51 with the pressing force corresponding to the force for pressing the wafer 12 onto the abrasive face 52. Therefore, the wafer 12 can be abraded with higher abrading accuracy.

Note that, if a pressure regulator (not shown), which adjusts the pressure in the first chamber 25, and a pressure reduction regulator (not shown), which adjust the pressure in the second chamber 35, are provided, the pressure in the first and the second chambers 25 and 35 can be separately controlled even if the compressed air is supplied from a common source.

If a pressure reducing unit (not shown) is communicated to the first chamber 25, the holding plate 22 can be drawn upward while the pressure reducing unit is driven. With this structure, only the pressing member 36, which is held by the elastic ring member 34, can be pressed onto the abrasive face 52 by driving the second pressurizing unit 39. In this case, if the dressing member is employed as the pressing member 36, the abrasive face 52 can be dressed by the dressing member.

If a pressure reducing unit (not shown) is communicated to the second chamber 35, the pressing member 36, which is held by the elastic ring member 34, can be drawn upward while the pressure reducing unit is driven. With this structure, only the wafer 12, which is held by the holding plate 22, can be pressed onto the abrasive face 52 by driving the first pressurizing unit 38, so that the surface 12a of the wafer 12 can be abraded without pressing the abrasive face 52 by the pressing member 36.

Third Embodiment

In the first and the second embodiments, the inner enclosing member 33 is separable from a base section 32, which includes the upper section 30b and the outer enclosing member 30a, of the outer head 30. In the third embodiment, the inner enclosing member 33 is integrated with the base section 32 of the outer head 30.

In the case of integrating the inner enclosing member 33 with the base section 32 of the outer head 30, if air paths for supplying the compressed air to the first and the second chambers 25 and 35 are separately formed, complex air-tight structures in the first and the second chambers 25 and 35 are not required. The structures can be simplified. In the case of employing the pressurizing unit 28 of the first embodiment, an air path from the pressurizing unit 28 is branched, and the branched paths are respectively connected to the air path 27a and the inlet 39a. In the case of employing the first and the second pressurizing units 38 and 39 of the second embodiment, the first pressurizing unit 38 is connected to the air path 27a and the second pressurizing unit 38 is connected to the inlet 39a.

In the third embodiment too, the force for pressing the wafer 12 and the force for pressing the pressing member 36 onto the abrasive face 52 can be respectively controlled by adjusting the pressure in the first and the second chambers 25 and 35. Further, the rotational speed of the wafer 12 and the pressing member 36 can be respectively controlled by the inner and the outer head driving units 44 and 54 (see FIG. 5). Therefore, the effects of the first and the second embodiments can be gained by the abrasive machine of the third embodiment.

In the above described embodiments, the wafer 12 is adhered, on the holding face 22a of the holding plate 22, by water, but the present invention is not limited to the embodiments.

For example, the wafer 12 may be sucked and held on the holding face 22a of the holding plate 22. In this case, a vacuum unit is communicated to the holding face 22a of the holding plate 22 so as to draw the wafer 12 by air suction.

The wafer 12 may be securely adhered on the holding face 22 by an adhesive.

Figure 9:
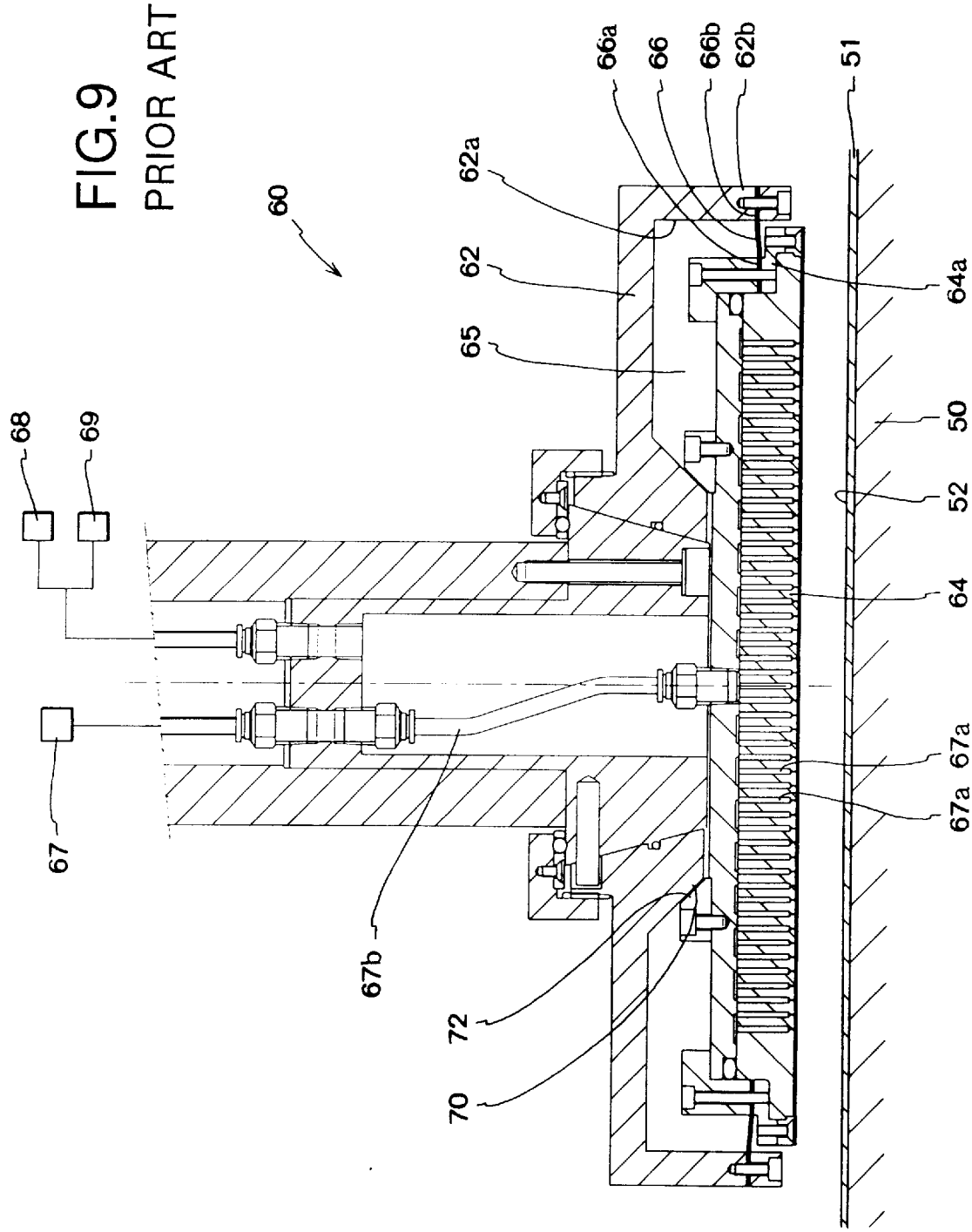
FIG. 9 is a sectional view of the wafer holding unit of the conventional abrasive machine.

The male tapered section 70 and the female tapered section 72 of the conventional abrasive machine (see FIG. 9) may be employed in the present invention. By fitting the male tapered section 70 in the female tapered section 72, the holding plate 22 can be precisely positioned, so that the wafer 12 can be positioned or adhered at a correct position. Therefore, abrading accuracy and abrading efficiency can be improved as well as the machine shown in FIG. 9.

In the above described embodiments, the wafer 12, which has been held by the holding plate 22, is pressed onto the abrasive face 52 by air pressure. For example, liquid pressure, e.g., water pressure, oil pressure, may be employed instead of the air pressure.

In the above described embodiments, the surface 12a of the silicon wafer 12 is abraded or polished as the work piece. Surfaces of other wafer-shaped work pieces, e.g., glass plates, crystal plates, can be abraded or polished properly.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An abrasive machine, comprising:
   a holding unit for holding a work piece; and
   an abrasive plate having an abrasive face, which abrades a surface of the work piece by relatively moving said abrasive plate with respect to said holding unit,
   wherein said holding unit includes:
      an inner head having a first concave section, whose opening section is headed toward the abrasive face of said abrasive plate;
      an outer head having a second concave section, in which said inner head is provided and whose opening section is headed toward the abrasive face of said abrasive plate,
      a holding plate being provided in the first concave section and having a holding face, on which the work piece is held;
      an elastic holding member being fixed to said inner head and said holding plate, allowing said holding plate to move with respect to said inner head, and forming a first chamber for pressing the work piece in the first concave section with said holding plate;
      an outer enclosing member being provided to said outer head and enclosing said inner head;
      an inner enclosing member being provided between said outer enclosing member and said inner head and enclosing said inner head;
      a pressing member for pressing the abrasive face of said abrasive plate, said pressing member being formed into a ring shape enclosing said holding plate;
      an elastic ring member being fixed to said outer enclosing member and said inner enclosing member, holding and allowing said pressing member to move with respect to said outer head, and forming a second chamber in the second concave section; and
      a pressurizing unit introducing pressurized fluid into said first chamber and said second chamber so as to press the work piece onto the abrasive face of said abrasive plate with said holding plate and so as to press said pressing member onto the abrasive face of said abrasive plate.

2. The abrasive machine according to claim 1,
wherein the pressurized fluid is introduce into said first chamber by a first pressurizing unit, and the pressurized fluid is introduce into said second chamber by a second pressurizing unit.

3. The abrasive machine according to claim 1,
further comprising:
   an inner head driving unit for rotating said inner head about a shaft, which is arranged perpendicular to the surface of the work piece, which has been held by said holding plate; and
   an outer head driving unit for rotating said outer head about another shaft, which is arranged perpendicular to the surface of the work piece, which has been held by said holding plate.

4. The abrasive machine according to claim 3,
wherein said inner enclosing member is separable from said outer head, connected to said outer head by said elastic ring member so as to be moved together with said outer head, and rotatably held by said inner head with a bearing.

* * * * *